US012525738B2

United States Patent
Komoto et al.

(10) Patent No.: US 12,525,738 B2
(45) Date of Patent: Jan. 13, 2026

(54) METHOD OF MANUFACTURING SHEET TYPE CONDUCTIVE MEMBER, SHEET TYPE CONDUCTIVE MEMBER, CONNECTOR, GARMENT, AND CONNECTOR MOUNTING METHOD

(71) Applicants: Japan Aviation Electronics Industry, Limited, Tokyo (JP); TISM CO., LTD., Kasugai (JP)

(72) Inventors: Tetsuya Komoto, Tokyo (JP); Akihiko Fushimi, Kasugai (JP)

(73) Assignees: JAPAN AVIATION ELECTRONICS INDUSTRY, LIMITED, Tokyo (JP); TISM CO., LTD., Aichi (JP)

( * ) Notice: Subject to any disclaimer, the term of this patent is extended or adjusted under 35 U.S.C. 154(b) by 324 days.

(21) Appl. No.: 18/329,758

(22) Filed: Jun. 6, 2023

(65) Prior Publication Data
US 2024/0030645 A1  Jan. 25, 2024

(30) Foreign Application Priority Data

Jul. 20, 2022 (JP) ................................. 2022-115497

(51) Int. Cl.
*H01R 13/502* (2006.01)
*A41D 1/00* (2018.01)
*H01R 13/424* (2006.01)

(52) U.S. Cl.
CPC ........... *H01R 13/502* (2013.01); *A41D 1/005* (2013.01); *H01R 13/424* (2013.01)

(58) Field of Classification Search
CPC .... H01R 13/502; H01R 13/424; H01R 12/65; H01R 12/59; H01R 12/7011; H01R 12/778; H01R 12/771; H01R 13/02; H01R 43/00; A41D 1/005; A41D 27/00; H05K 1/189; H05K 2201/0281; H05K 2201/10189; H05K 1/038; H05K 1/118; H01B 13/00; H01B 7/0045; H01B 7/04; H01B 7/083
See application file for complete search history.

(56) References Cited

U.S. PATENT DOCUMENTS 10,868,380 B1 * 12/2020 Komoto ............... H01R 12/771
2019/0166924 A1 * 6/2019 Komoto ............... H01R 13/73
2020/0022425 A1 * 1/2020 Hashiguchi .......... H01R 13/665
(Continued)

FOREIGN PATENT DOCUMENTS

EP        3800739 A1 *  4/2021  ........... H01R 9/2416
EP        4 000 436 A1    5/2022
JP        2021061225 A    4/2021

*Primary Examiner* — Abdullah A Riyami
*Assistant Examiner* — Nader J Alhawamdeh
(74) *Attorney, Agent, or Firm* — MUNCY, GEISSLER, OLDS & LOWE, P.C.

(57) ABSTRACT

A method of manufacturing a sheet type conductive member is a method in which, by continuously embroidering or weaving a conductive thread on or into an insulating sheet member including a sheet body region and a peripheral region, a plurality of flexible conductors situated inside the sheet body region and at least one connection conductor situated in the peripheral region and interconnecting corresponding two flexible conductors are formed, and thereafter, the peripheral region of the sheet member is separated from the sheet body region, and the at least one connection conductor is separated from the plurality of flexible conductors.

17 Claims, 13 Drawing Sheets

(56) References Cited

U.S. PATENT DOCUMENTS

| | | | |
|---|---|---|---|
| 2021/0036450 A1* | 2/2021 | Komoto | H01R 12/78 |
| 2021/0104824 A1 | 4/2021 | Hashiguchi et al. | |
| 2022/0158373 A1* | 5/2022 | Komoto | H01R 13/502 |
| 2022/0302617 A1* | 9/2022 | Komoto | H01R 12/592 |
| 2023/0420902 A1* | 12/2023 | Kimura | H01R 12/777 |
| 2024/0030630 A1* | 1/2024 | Komoto | H01R 12/7011 |
| 2024/0030631 A1* | 1/2024 | Komoto | H01R 12/59 |
| 2024/0030637 A1* | 1/2024 | Komoto | H01R 12/7011 |
| 2024/0030645 A1* | 1/2024 | Komoto | A41D 1/005 |

* cited by examiner

METHOD OF MANUFACTURING SHEET TYPE CONDUCTIVE MEMBER, SHEET TYPE CONDUCTIVE MEMBER, CONNECTOR, GARMENT, AND CONNECTOR MOUNTING METHOD

BACKGROUND OF THE INVENTION

The present invention relates to a method of manufacturing a sheet type conductive member and a sheet type conductive member, particularly to a method of manufacturing a sheet type conductive member that is attached to a connector mounted on a mounting object such as a garment and that electrically connects a wiring portion of the mounting object to a contact of the connector, and the sheet type conductive member.

The present invention also relates to a connector having the sheet type conductive member, a garment having the connector mounted thereon, and a connector mounting method for mounting the connector on a garment.

In recent years, attention has been drawn to so-called smart clothes that can obtain user's biological data such as the heart rate and the body temperature only by being worn by the user. Such smart clothes has an electrode disposed at a measurement site, and when a wearable device serving as a measurement device is electrically connected to the electrode, biological data can be transmitted to the wearable device.

The electrode and the wearable device can be interconnected by, for instance, use of a connector connected to a wiring portion drawn from the electrode.

As a connector of this type, for example, JP 2021-61225 A discloses a connector 1 as illustrated in FIG. 23. The connector 1 has the structure in which plural contacts 3 are retained on a first insulator 2, and a tab sheet 5, a sheet type conductive member 6, and a support sheet 7 are sandwiched and retained between the first insulator 2 and a second insulator 4.

The connector 1 is attached to a garment 8 by fixing the tab sheet 5 to the garment 8.

The sheet type conductive member 6 is provided at its central portion with a cut 6A used to attach the sheet type conductive member 6 to the connector 1, and one end portions of plural flexible conductors 6B are disposed in a bilaterally symmetrical manner on the opposite sides of the cut 6A across the cut 6A on a surface of the sheet type conductive member 6. Those one end portions of the flexible conductors 6B are arranged with narrow pitch the same as the arrangement pitch of the contacts 3 so as to be connected to the contacts 3.

When the sheet type conductive member 6 is attached to the connector 1, the one end portion of each flexible conductor 6B makes contact with and is connected to the corresponding contact 3, and the other end portion thereof is connected to a conductive wiring portion (not shown) disposed on the garment 8.

Consequently, electrodes of the garment 8 disposed at measurement sites are electrically connected to the contacts 3 of the connector 1 via the wiring portions and the flexible conductors 6B.

The flexible conductors 6B of the sheet type conductive member 6 may be formed by, for instance, embroidering or weaving a conductive thread on or into a sheet body made of insulating cloth or knitted fabric.

However, in the case of forming the flexible conductors 6B by embroidering or weaving a conductive thread, the flexible conductors 6B need to be formed separately or individually in order to avoid a short between adjacent flexible conductors 6B. Accordingly, it is necessary to repeat embroidering or weaving of a conductive thread as many times as the number of the flexible conductors 6B, and this requires considerable time and work in manufacture of the sheet type conductive member 6.

SUMMARY OF THE INVENTION

The present invention has been made to overcome the conventional problem as above and aims at providing a method of manufacturing a sheet type conductive member that makes it possible to easily manufacture a sheet type conductive member despite forming a plurality of flexible conductors with a conductive thread.

The present invention also aims at providing a sheet type conductive member manufactured by the method of manufacturing a sheet type conductive member, a connector having the sheet type conductive member, a garment having the connector mounted thereon, and a connector mounting method for mounting the connector on a garment.

A manufacturing method according to the present invention is a method of manufacturing a sheet type conductive member that is attached to a connector mounted on a mounting object and that electrically connects a plurality of wiring portions of the mounting object to a plurality of contacts of the connector, the method comprising:
   forming a plurality of flexible conductors and at least one connection conductor by continuously embroidering or weaving a conductive thread on or into a sheet member such that the conductive thread is exposed on a surface of the sheet member, the sheet member having an insulating property and including a sheet body region and a peripheral region situated on a periphery of the sheet body region, the plurality of flexible conductors being situated inside the sheet body region and each including a first end portion electrically connected to a corresponding one of the plurality of wiring portions, a second end portion electrically connected to a corresponding one of the plurality of contacts, and a joint portion joining the first end portion and the second end portion together, and the at least one connection conductor being situated in the peripheral region and interconnecting corresponding two of the plurality of flexible conductors; and
   separating the peripheral region of the sheet member from the sheet body region and separating the at least one connection conductor from the plurality of flexible conductors.

A sheet type conductive member according to the present invention is one that is attached to a connector mounted on a mounting object and that electrically connects a plurality of wiring portions of the mounting object to a plurality of contacts of the connector, the sheet type conductive member comprising:
   a sheet body having an insulating property; and
   a plurality of flexible conductors formed of a conductive thread embroidered on or woven into the sheet body so as to be exposed on a surface of the sheet body, each flexible conductor extending along the surface of the sheet body,
   wherein the plurality of flexible conductors each include a first end portion electrically connected to a corresponding one of the plurality of wiring portions, a second end portion electrically connected to a corresponding one of the plurality of contacts, and a joint portion joining the first end portion and the second end portion together, and a portion of the conductive thread continuing to another portion of the conductive thread which forms the first end portion extends from the first end portion to an edge portion of the sheet body.

A connector according to the present invention is one mounted on the mounting object, the connector comprising:

the sheet type conductive member according to claim 5;

the contact electrically connected to the second end portion of the sheet type conductive member; and a housing having an insulating property configured to retain the sheet type conductive member and the contact, wherein the connector is fitted to a counter connector in a fitting direction.

A garment according to the present invention is one serving as the mounting object on which the above-mentioned connector is mounted.

A connector mounting method according to the present invention is one for mounting the above-mentioned connector on a garment serving as the mounting object, the connector mounting method comprising:

positioning the sheet type conductive member with respect to the garment such that the first end portion of the sheet type conductive member is superposed on the wiring portion of the garment; and sewing the first end portion to the wiring portion to thereby attach the sheet type conductive member to the garment and electrically connect the first end portion to the wiring portion.

DETAILED DESCRIPTION OF THE INVENTION

An embodiment of the present invention is described below based on the accompanying drawings.

Figure 1:
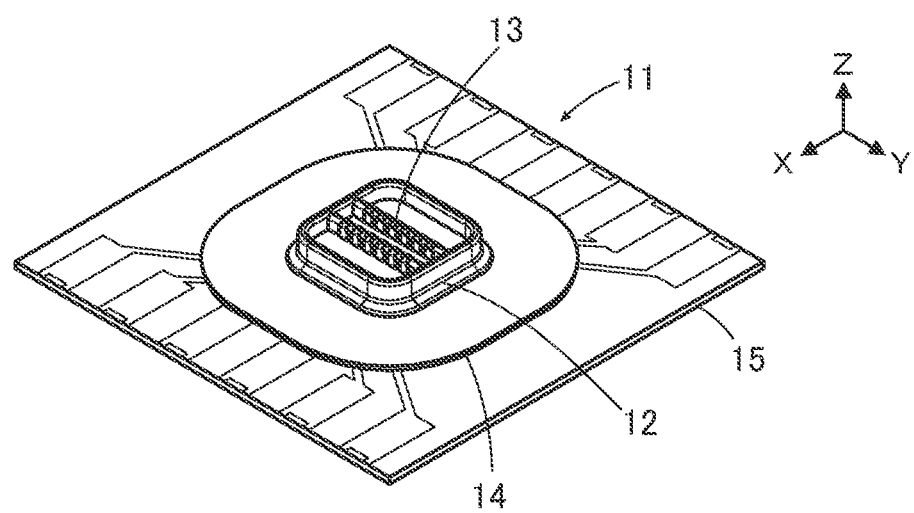
FIG. 1 is a perspective view showing a connector according to an embodiment.
Figure 2:
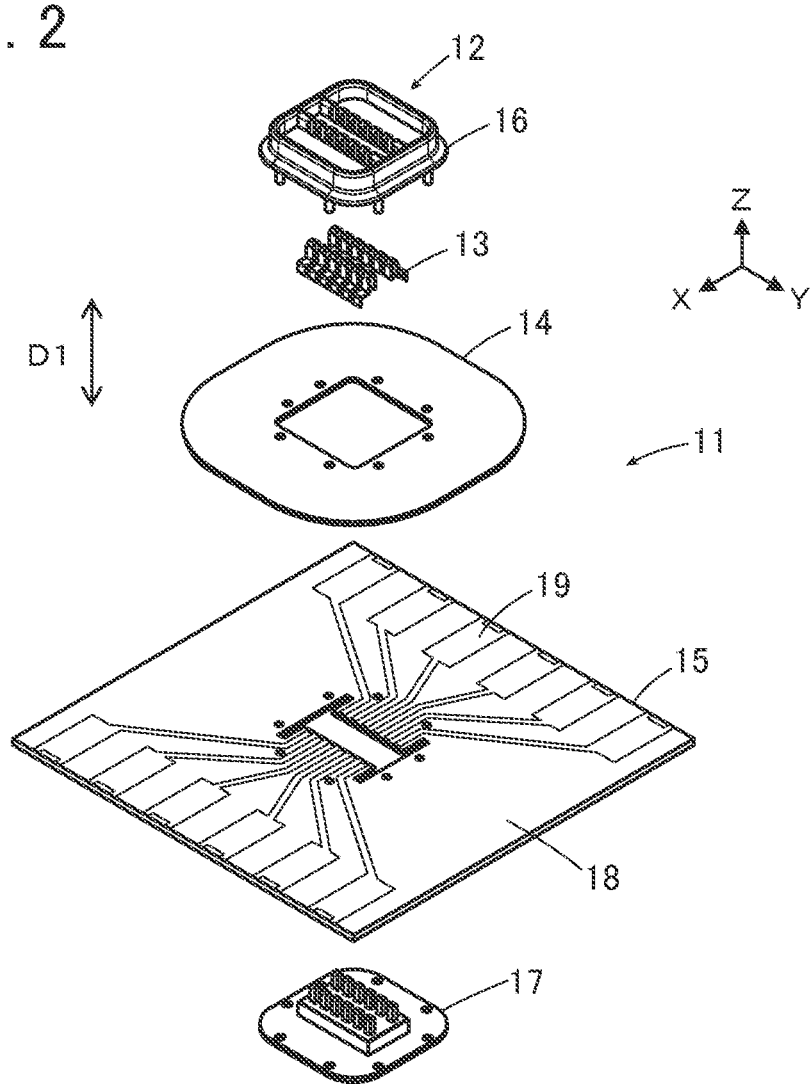
FIG. 2 is an exploded perspective view of the connector according to the embodiment, as viewed from an obliquely upper position.

FIGS. 1 and 2 show a connector 11 according to the embodiment. The connector 11 is mounted on a garment that is a mounting object having a conductive wiring portion and is used as a connector for fitting a wearable device, for instance. The connector 11 includes a housing 12 made of an insulating material. A plurality of contacts 13 are retained in the housing 12, and a tab sheet 14 and a sheet type conductive member 15 being superposed on each other are retained by the housing 12.

The contacts 13 are arranged in two rows parallel to each other and disposed to project perpendicularly to the sheet type conductive member 15.

For convenience, the tab sheet 14 and the sheet type conductive member 15 are defined as extending in an XY plane, the arrangement direction of the contacts 13 is referred to as "Y direction," and the direction in which the contacts 13 project is referred to as "+Z direction." The Z direction is a fitting direction in which the connector 11 is fitted to a counter connector.

Figure 3:
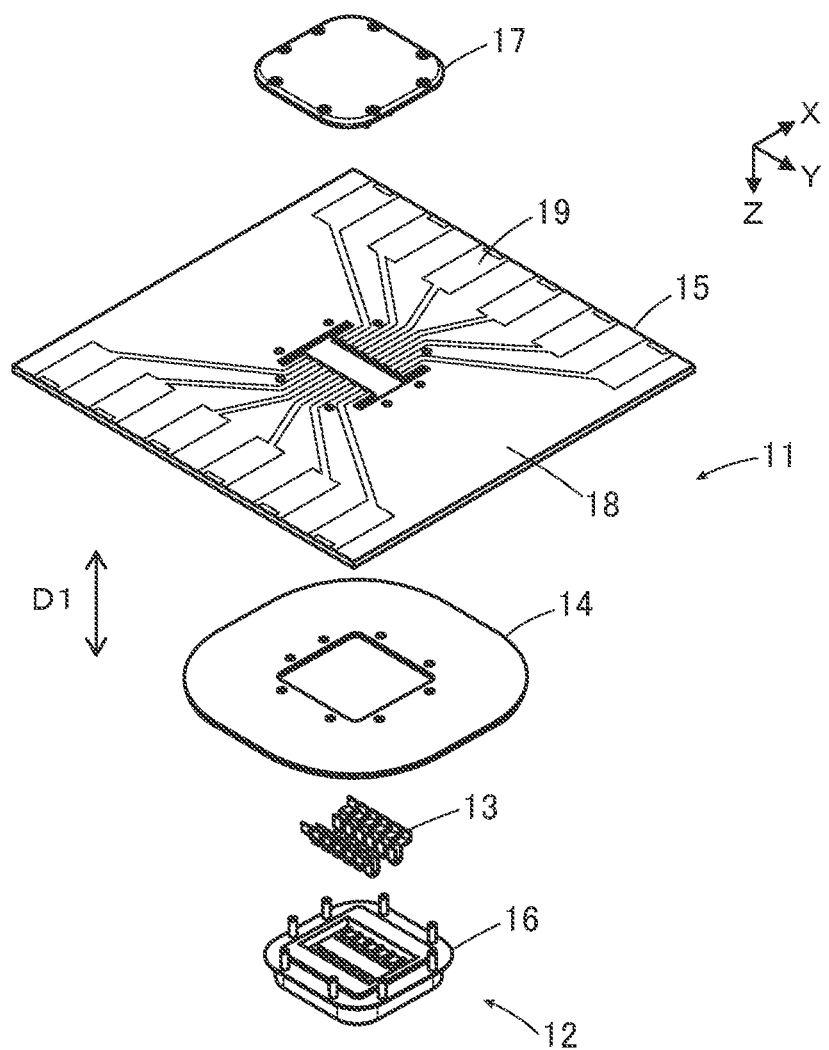
FIG. 3 is an exploded perspective view of the connector according to the embodiment, as viewed from an obliquely lower position.

FIGS. 2 and 3 are exploded perspective views of the connector 11. The connector 11 includes a first insulator 16 and a second insulator 17, and these first and second insulators 16 and 17 constitute the housing 12.

The contacts 13 are separately and temporarily retained in the first insulator 16, and the second insulator 17 is assembled to the first insulator 16 in the Z direction which is a predetermined assembling direction D1, with the second insulator 17 and the first insulator 16 sandwiching the sheet type conductive member 15 and the tab sheet 14 therebetween. The predetermined assembling direction D1 is the same as the fitting direction in which the connector 11 is fitted to a counter connector.

The sheet type conductive member 15 has a sheet body 18, and an embroidery pattern 19 embroidered on the sheet body 18 with embroidery threads. The embroidery pattern 19 is seen on both the front and back sides, facing the +Z and −Z directions, of the sheet type conductive member 15 as shown in FIGS. 2 and 3.

Figure 4:
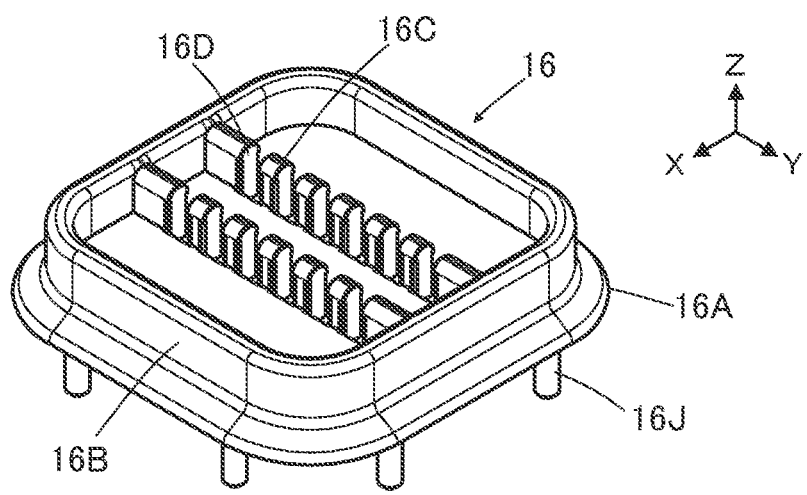
FIG. 4 is a perspective view of a first insulator used in the connector according to the embodiment, as viewed from an obliquely upper position.
Figure 5:
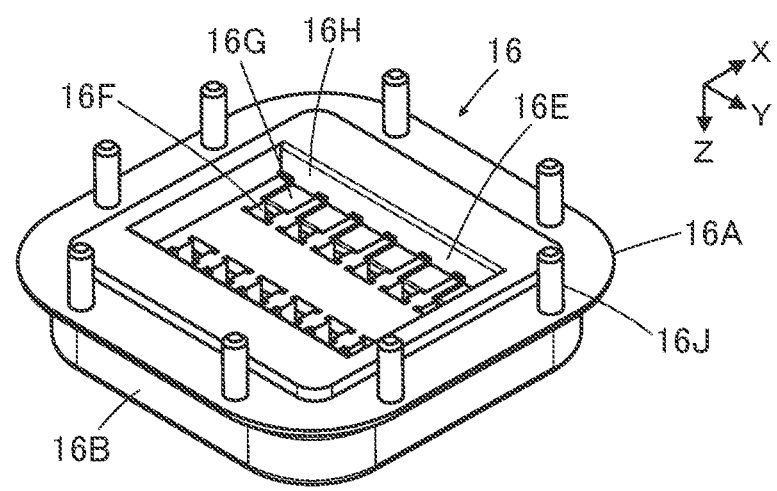
FIG. 5 is a perspective view of the first insulator used in the connector according to the embodiment, as viewed from an obliquely lower position.

As shown in FIGS. 4 and 5, the first insulator 16 includes a base portion 16A of flat rectangular shape extending in an XY plane, a peripheral wall portion 16B projecting in the +Z direction from the circumferential edge portion of the base portion 16A, and a plurality of projection portions 16C projecting in the +Z direction from a surface of the base portion 16A and arranged in two rows parallel to each other within the region surrounded by the peripheral wall portion 16B. A gap 16D is formed between each adjacent pair of projection portions 16C.

A recess portion 16E of rectangular shape that opens in the −Z direction is formed at the −Z direction-side surface of the base portion 16A, and the bottom of the recess portion 16E is provided with a plurality of through-holes 16F penetrating from the corresponding gaps 16D on the +Z direction side of the base portion 16A to the recess portion 16E. The through-holes 16F correspond to the contacts 13 and are arranged in two rows parallel to each other.

The bottom of the recess portion 16E is provided with a plurality of retaining surfaces 16G adjacent to the through-holes 16F in the X direction. Each retaining surface 16G flatly extends in an XY plane between the corresponding through-hole 16F and an inner wall surface 16H, facing the X direction, of the recess portion 16E.

The inner wall surfaces 16H, facing the X direction, of the recess portion 16E each constitute a first opposed surface extending in the Z direction that is the fitting direction.

Further, the −Z direction-side surface of the base portion 16A is provided with a plurality of fixing posts 16J projecting in the −Z direction.

Figure 6:
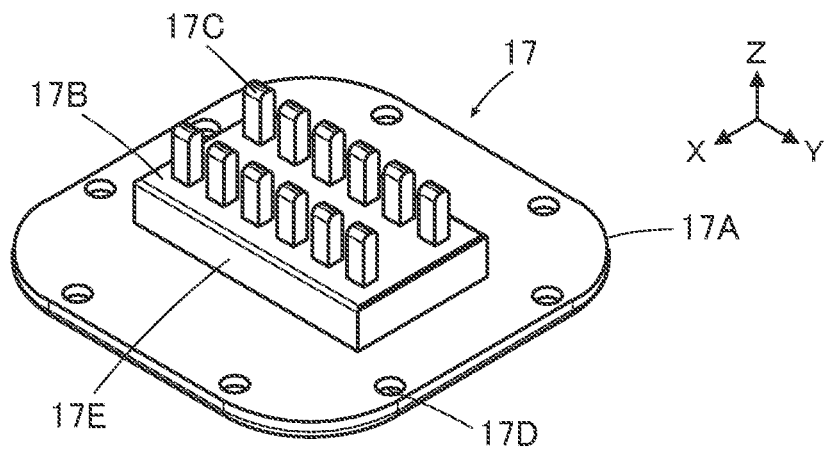
FIG. 6 is a perspective view of a second insulator used in the connector according to the embodiment, as viewed from an obliquely upper position.
Figure 7:
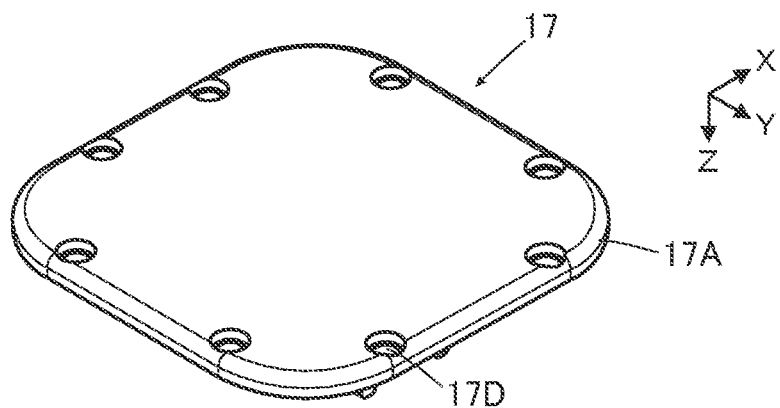
FIG. 7 is a perspective view of the second insulator used in the connector according to the embodiment, as viewed from an obliquely lower position.

As shown in FIGS. 6 and 7, the second insulator 17 includes a base portion 17A of flat plate shape extending in an XY plane, a jut portion 17B of cuboid shape situated in the center of the base portion 17A and projecting in the +Z direction from the base portion 17A, and a plurality of columnar members 17C projecting in the +Z direction from the jut portion 17B.

The jut portion 17B is inserted into the recess portion 16E of the first insulator 16 in assembling with the first insulator 16, and has a size slightly smaller than that of the recess portion 16E.

The columnar members 17C correspond to the contacts 13 and are arranged in two rows parallel to each other.

The base portion 17A is provided with a plurality of through-holes 17D situated around the jut portion 17B and penetrating through the base portion 17A in the Z direction. Those through-holes 17D correspond to the fixing posts 16J of the first insulator 16.

Outer surfaces 17E, facing the X direction, of the jut portion 17B each constitute a second opposed surface extending in the Z direction that is the fitting direction.

Figure 8:
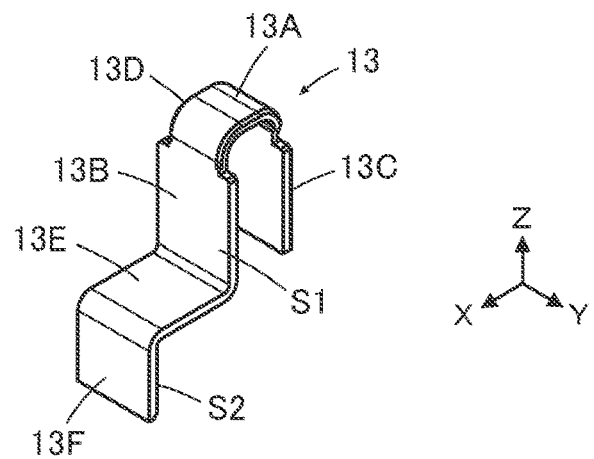
FIG. 8 is a perspective view of a contact used in the connector according to the embodiment, as viewed from an obliquely upper position.
Figure 9:
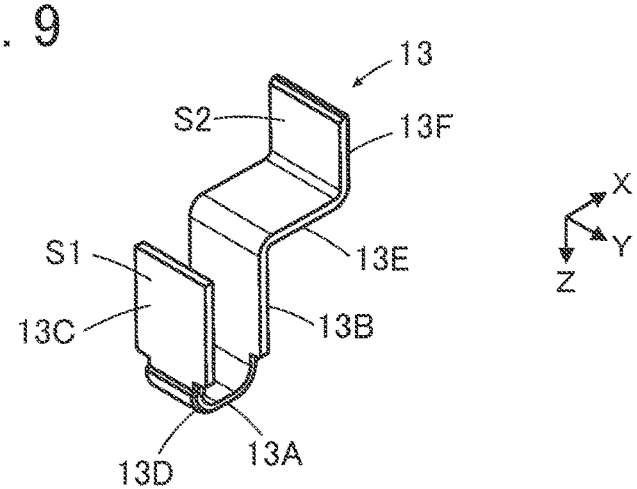
FIG. 9 is a perspective view of the contact used in the connector according to the embodiment, as viewed from an obliquely lower position.

FIGS. 8 and 9 show the structure of each of the contacts 13 arranged on the +X direction side, of the plurality of contacts 13 shown in FIGS. 2 and 3.

The contact 13 is constituted of a plug type contact formed of a band-shaped member made of a conductive material such as metal and includes a U-shaped portion 13A extending in the Z direction and bent in a U shape. The U-shaped portion 13A is composed of a pair of extension portions 13B and 13C extending along a YZ plane and facing each other in the X direction and a top portion 13D joining the +Z directional ends of the extension portions 13B and 13C to each other. The −Z directional end of the extension portion 13B is connected to a flat plate portion 13F extending in a YZ plane via a retained portion 13E extending in an XY plane.

An outer surface of the U-shaped portion 13A forms a contacting portion S1 that is to make contact with a contact of a counter connector, and a surface, on the −X direction side, of the flat plate portion 13F forms a connection portion S2 that is to make contact with a surface of the sheet type conductive member 15.

When the contact 13 is retained in the housing 12 shown in FIGS. 2 and 3, the contacting portion S1 of the contact 13 projects in the +Z direction from the housing 12, while the connection portion S2 of the contact 13 is situated inside the housing 12.

Note that, of the plurality of contacts 13 shown in FIGS. 2 and 3, the contacts 13 arranged on the −X direction side have the same structure as that of the contact 13 shown in FIGS. 8 and 9 but are disposed in the opposite orientation in the X direction.

Figure 10:
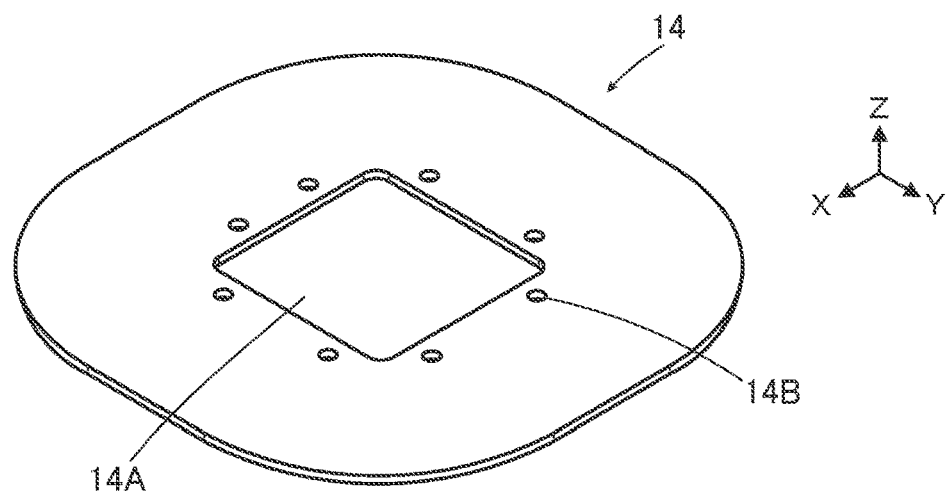
FIG. 10 is a perspective view showing a tab sheet used in the connector according to the embodiment.

As shown in FIG. 10, the tab sheet 14 is used for attaching the connector 11 to a garment by fixing the tab sheet 14 to the garment by sewing or other means. The tab sheet 14 is made of an insulating material such as resin or cloth, and has a size larger than that of the base portion 16A of the first insulator 16 and that of the base portion 17A of the second insulator 17 in an XY plane.

A substantially square opening portion 14A is formed in a central portion of the tab sheet 14. When the first insulator 16 and the second insulator 17 are assembled together, a portion of the tab sheet 14 around the opening portion 14A is, along with the sheet type conductive member 15, sandwiched between the base portion 16A of the first insulator 16 and the base portion 17A of the second insulator 17, and at this time, the jut portion 17B and the columnar members 17C of the second insulator 17 are inserted into the opening portion 14A.

A plurality of through-holes 14B are formed around the opening portion 14A of the tab sheet 14. Those through-holes 14B correspond to the fixing posts 16J of the first insulator 16.

Figure 11:
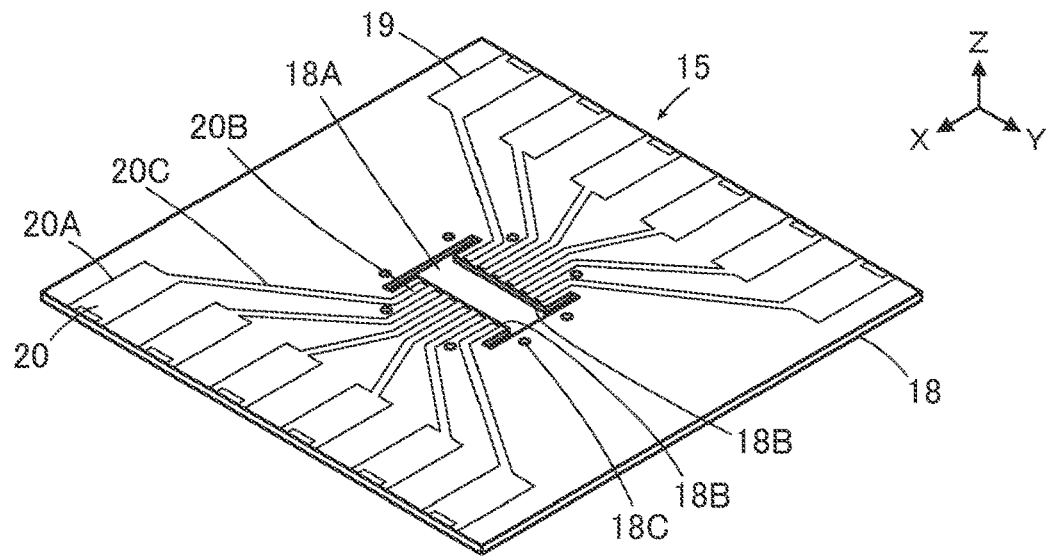
FIG. 11 is a perspective view showing a sheet type conductive member used in the connector according to the embodiment.

The sheet type conductive member 15 is used for electrically connecting a plurality of wiring portions of a garment on which the connector 11 is mounted, to the contacts 13. As shown in FIG. 11, the sheet type conductive member 15 includes: the sheet body 18 formed of insulating cloth or knitted fabric; and the embroidery pattern 19 embroidered on the sheet body 18 with embroidery threads.

The sheet body 18 has a substantially square shape, extends in an XY plane, and has an H-shaped opening portion 18A in its central portion. The opening portion 18A is used when the sheet type conductive member 15 is attached to the connector 11, and the opening portion 18A is provided with a pair of protrusion pieces 18B that are formed of part of the sheet body 18 and protrude to face each other in the X direction inside the opening portion 18A.

A plurality of through-holes 18C are formed around the opening portion 18A of the sheet body 18. Those through-holes 18C correspond to the fixing posts 16J of the first insulator 16.

Of the embroidery threads forming the embroidery pattern 19, a conductive thread is used only for a part exposed on the surface of the sheet body 18 on the +Z direction side, while an insulating thread is used for a part exposed on the surface of the sheet body 18 on the −Z direction side. A flexible conductor 20 exposed on the surface of the sheet type conductive member 15 on the +Z direction side is thus formed. In other words, the flexible conductor 20 is formed by embroidery using a conductive thread.

The sheet type conductive member 15 includes a plurality of flexible conductors 20 disposed on the +X direction side of the opening portion 18A of the sheet body 18 and a plurality of flexible conductors 20 disposed on the −X direction side of the opening portion 18A.

Each flexible conductor 20 includes a first end portion 20A disposed near a side, extending in the Y direction, of the square sheet body 18, a second end portion 20B disposed on the protrusion piece 18B of the sheet body 18, and a joint portion 20C joining the first end portion 20A and the second end portion 20B together. When the connector 11 is mounted on a garment, the first end portion 20A is connected to the corresponding wiring portion of the garment, and the second end portion 20B is connected to the corresponding contact 13 of the connector 11.

The second end portions 20B of the flexible conductors 20 disposed on the +X direction side of the opening portion 18A of the sheet body 18 and those disposed on the −X direction side of the opening portion 18A of the sheet body 18 are arranged in two rows on the opposite sides of the opening portion 18A to face each other across the opening portion 18A.

Figure 12:
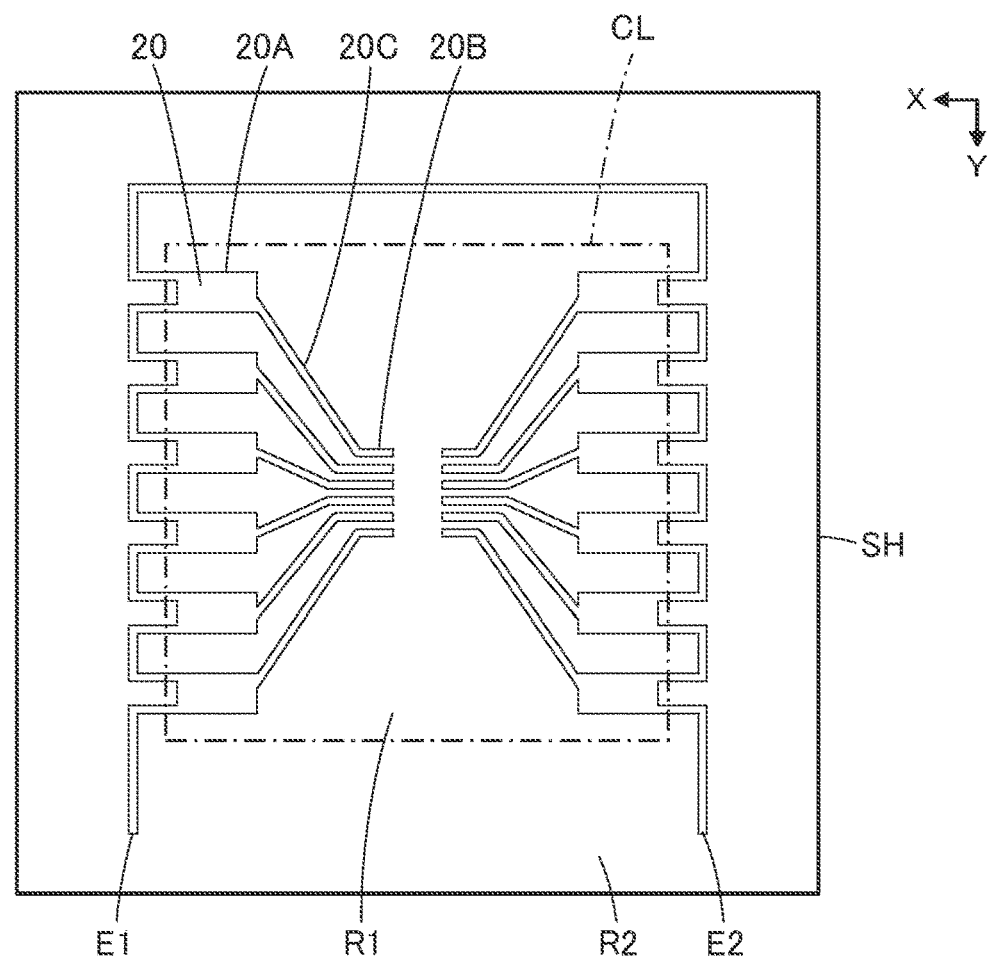
FIG. 12 is a plan view used for describing a manufacturing method of the sheet type conductive member used in the connector according to the embodiment.

Next, the method of manufacturing the sheet type conductive member 15 having the foregoing structure is described. A sheet member SH extending in an XY plane as shown in FIG. 12 is prepared. The sheet member SH is made of insulating cloth or knitted fabric and includes: a sheet body region R1 having a substantially square shape and disposed in the center; and a peripheral region R2 situated on the periphery of the sheet body region R1. A cutting line CL of substantially square shape is set on the boundary portion between the sheet body region R1 and the peripheral region R2. The sheet body region R1 is a region corresponding to the sheet body 18 of the sheet type conductive member 15.

First, embroidery on the sheet member SH using a conductive thread is started from an embroidery start point E1 set in the peripheral region R2, and the conductive thread is embroidered to enter the sheet body region R1 from the peripheral region R2. After, of the flexible conductors 20, the first flexible conductor 20 is formed, the conductive thread is embroidered to exit from the sheet body region R1 to the peripheral region R2 once and re-enter the sheet body region R1 while changing the position to enter the sheet body region R1, thereby forming the second flexible conductor 20.

At the time of being embroidered to exit from the sheet body region R1 to the peripheral region R2, the conductive thread may be sewed on a portion of the conductive thread having been embroidered to enter the sheet body region R1 from the peripheral region R2, so as to overlap the portion.

The entrance into the sheet body region R1, the formation of one flexible conductor 20, and the exit to the peripheral region R2 are repeated in the same manner, and after the final flexible conductor 20 is formed in the sheet body region R1, the conductive thread is embroidered to exit from the sheet body region R1 to the peripheral region R2 and proceed up to an embroidery end point E2.

The plurality of flexible conductors 20 are thus formed in the sheet body region R1 of the sheet member SH by continuously embroidering the conductive thread like drawing in one stroke from the embroidery start point E1 up to the embroidery end point E2.

Figure 13:
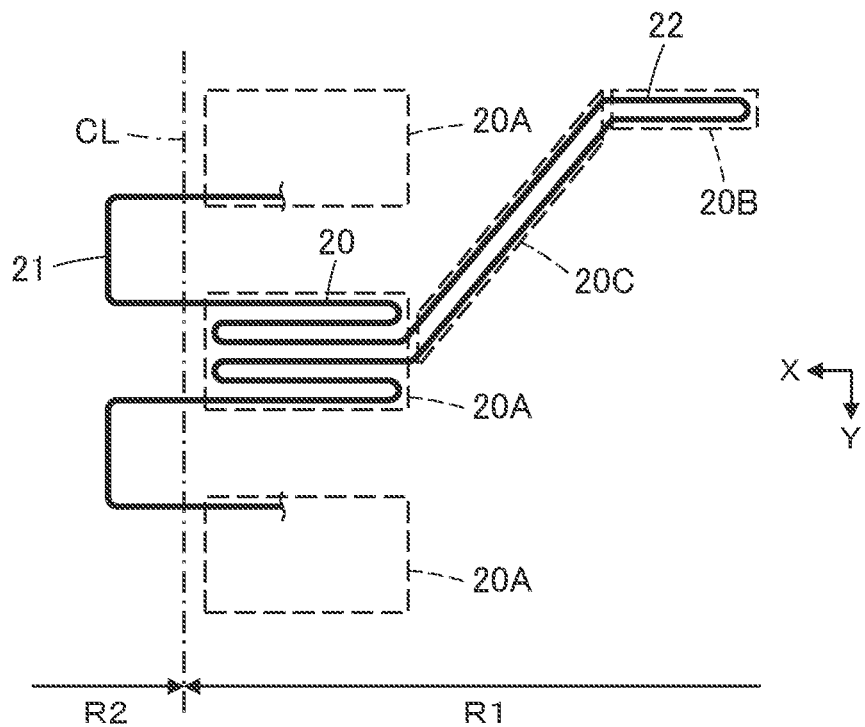
FIG. 13 is an enlarged partial view of FIG. 12.

In this process, as shown in FIG. 13, the conductive thread 22 having been embroidered to enter the sheet body region R1 from the peripheral region R2 may first form a part of the first end portion 20A of one flexible conductor 20, whereafter the conductive thread 22 may be embroidered to proceed from the first end portion 20A to the second end portion 20B through the joint portion 20C, turn back at the second end portion 20B to return to the first end portion 20A through the joint portion 20C, and then form the remainder of the first end portion 20A.

When the formation of one flexible conductor 20 is finished, the conductive thread 22 is embroidered to exit from the sheet body region R1 to the peripheral region R2 once, proceed to the position of the first end portion 20A of the next flexible conductor 20 in the peripheral region R2, where the conductive thread 22 serves as a connection conductor 21, and re-enter the sheet body region R1 from the peripheral region R2 to form the next flexible conductor 20.

When the formation of all the flexible conductors 20 is finished, now the flexible conductors 20 are disposed inside the sheet body region R1, and the connection conductors 21 sequentially connecting the flexible conductors 20 are disposed in the peripheral region R2.

The flexible conductors 20 and the connection conductors 21 as above can be formed, for example, with an embroidery machine or by hand sewing.

In this state, the sheet member SH and the conductive thread 22 are cut along the cutting line CL of substantially square shape as shown in FIG. 12. In this process, the sheet member SH cut along the cutting line CL forms the sheet body 18, and at the same time, the opening portion 18A is formed by cutting the sheet member SH in a central portion of the sheet body region R1, the central portion being surrounded by the flexible conductors 20, thus manufacturing the sheet type conductive member 15 shown in FIG. 11.

The opening portion 18A may be formed not simultaneously with the cutting of the sheet member SH and the sheet body 18 along the cutting line CL but by cutting away the central portion of the sheet body 18 in a separate step after the formation of the sheet body 18. Alternatively, use may be made of the sheet member SH having the opening portion 18A formed in advance.

When the sheet member SH and the conductive thread 22 are cut along the cutting line CL, the cutting line CL needs to be set outside the first end portions 20A of the flexible conductors 20 to separate therefrom by a predetermined distance so as not to break the first end portions 20A of the flexible conductors 20.

Figure 14:
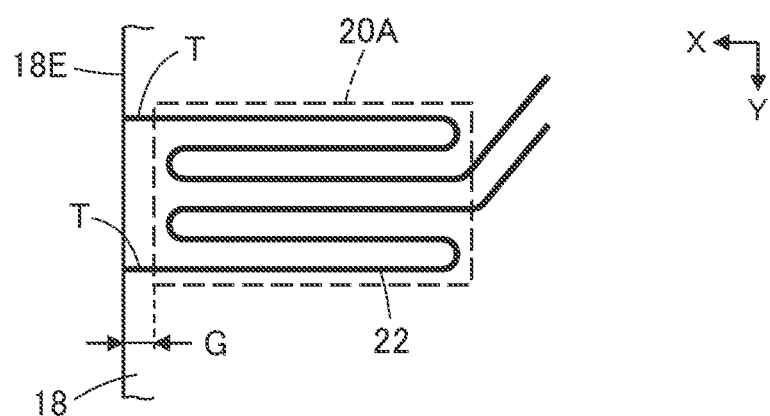
FIG. 14 is a partial plan view showing the sheet type conductive member used in the connector according to the embodiment.

Accordingly, upon cutting the sheet member SH and the conductive thread 22 along the cutting line CL, as shown in FIG. 14, a predetermined gap G is formed between each first end portion 20A and an edge portion 18E of the sheet body 18 formed from the sheet member SH along the cutting line CL, and two portions of the conductive thread 22 continuing to another portion of the conductive thread 22 which forms the first end portion 20A extend from the first end portion 20A up to the edge portion 18E of the sheet body 18 to cross the gap G. The two portions of the conductive thread 22 crossing the gap G remain on the sheet body 18 as traces T showing that the flexible conductors 20 have been formed by continuously embroidering the conductive thread 22.

Since the flexible conductors 20 are formed by continuously embroidering the conductive thread 22 on the sheet member SH like drawing in one stroke from the embroidery start point E1 up to the embroidery end point E2, it is not necessary to form the flexible conductors 20 separately or individually. Thus, the sheet type conductive member 15 can be easily manufactured without need for considerable time and work, despite forming the flexible conductors 20 with the conductive thread 22.

In the foregoing method of manufacturing the sheet type conductive member 15, the connection conductor 21 is disposed to interconnect adjacent flexible conductors 20 as shown in FIG. 13; however, the connection conductor 21 does not necessarily interconnect adjacent flexible conductors 20 and may be disposed to interconnect two flexible conductors 20 that are separate with another flexible conductor 20 being disposed therebetween.

When the number of the flexible conductors 20 disposed inside the sheet body region R1 is two, a single connection conductor 21 is disposed in the peripheral region R2 accordingly.

Figure 15:
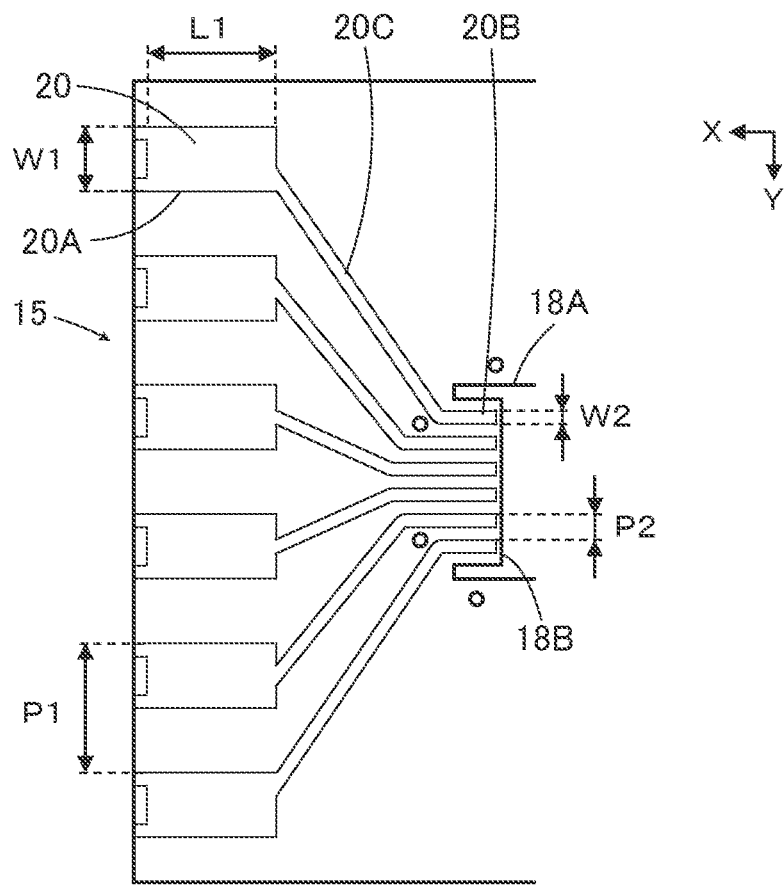
FIG. 15 is a partial plan view showing the sheet type conductive member used in the connector according to the embodiment.

As shown in FIG. 15, in the flexible conductors 20 disposed on the +X direction side of the opening portion 18A of the sheet body 18, the first end portions 20A are linearly arranged in the Y direction with first arrangement pitch P1, and the second end portions 20B are linearly arranged in the Y direction with second arrangement pitch P2 in parallel to the first end portions 20A. The second arrangement pitch P2 of the second end portions 20B corresponds to arrangement pitch of the contacts 13 in the Y direction.

The first arrangement pitch P1 of the first end portions is set larger than the second arrangement pitch P2 of the second end portions 20B.

In addition, a width W1, in the Y direction, of the first end portion 20A of each flexible conductor 20 is set larger than a width W2, in the Y direction, of the second end portion and the joint portion 20C has the same width as that of the second end portion 20B.

In other words, the first end portions 20A are arranged in the Y direction with the first arrangement pitch P1 larger than the arrangement pitch of the contacts 13, and thus, the first end portions 20A are configured such that a larger distance can be ensured between every two first end portions 20A adjacent in the Y direction even though the first end portions 20A have the width W1 larger than the width W2 of the second end portions 20B.

In addition, the first end portion 20A of each flexible conductor 20 has a length L1 in the X direction larger than the width W1 in the Y direction.

Likewise, in the flexible conductors 20 disposed on the −X direction side of the opening portion 18A of the sheet body 18, the first end portions 20A are linearly arranged in the Y direction with the first arrangement pitch P1, and the second end portions 20B are linearly arranged in the Y direction with the second arrangement pitch P2 in parallel to the first end portions 20A.

Furthermore, also in the flexible conductors 20 disposed on the −X direction side of the opening portion 18A of the sheet body 18, the first end portion 20A of each flexible conductor 20 has the width W1 in the Y direction larger than the width W2 of the second end portion 20B in the Y direction, the joint portion 20C has the same width as that of the second end portion 20B, and the first end portion 20A has the length L1 in the X direction larger than the width W1 in the Y direction.

When the connector 11 is assembled, first, the respective contacts 13 are pushed into the first insulator 16 from the −Z direction toward the +Z direction, whereby the contacts 13 are temporarily retained in the first insulator 16. In this process, the U-shaped portion 13A of each contact 13 is passed through the corresponding through-hole 16F from the recess portion 16E on the −Z direction side of the first insulator 16 and inserted into the corresponding gap 16D formed between adjacent projection portions 16C, so that the contacting portion S1 formed of the outer surface of the U-shaped portion 13A is exposed on the +Z direction side of the first insulator 16.

The retained portion 13E and the flat plate portion 13F, which forms the connection portion S2, of each contact 13 are situated inside the recess portion 16E of the first insulator 16, and the flat plate portion 13F makes contact with the inner wall surface 16H of the recess portion 16E of the first insulator 16.

Now, the fixing posts 16J of the first insulator 16 are sequentially passed through the through-holes 14B of the tab sheet 14 and the through-holes 18C of the sheet type conductive member 15 such that the tab sheet 14 and the sheet type conductive member 15 lie on the −Z direction side of the first insulator 16. The fixing posts 16J of the first insulator 16 are further passed through the through-holes 17D of the second insulator 17, and the second insulator 17 is moved in the +Z direction toward the first insulator 16 to start the assembly into the first insulator 16.

In this process, the columnar members 17C of the second insulator 17 are each inserted into the inside of the U-shaped portion 13A of the corresponding contact 13 from the −Z direction.

Further, the jut portion 17B of the second insulator 17 is sequentially passed through the opening portion 18A of the sheet type conductive member 15 and the opening portion 14A of the tab sheet 14 from the −Z direction and then inserted into the recess portion 16E of the first insulator 16. In this process, the pair of protrusion pieces 18B situated inside the opening portion 18A of the sheet type conductive member 15 are pushed while being bent toward the +Z direction by the jut portion 17B of the second insulator 17 and each enter between the flat plate portion 13F of the contact 13 in contact with the inner wall surface 16H of the recess portion 16E of the first insulator 16 and the outer surface 17E of the jut portion 17B of the second insulator 17.

Figure 16:
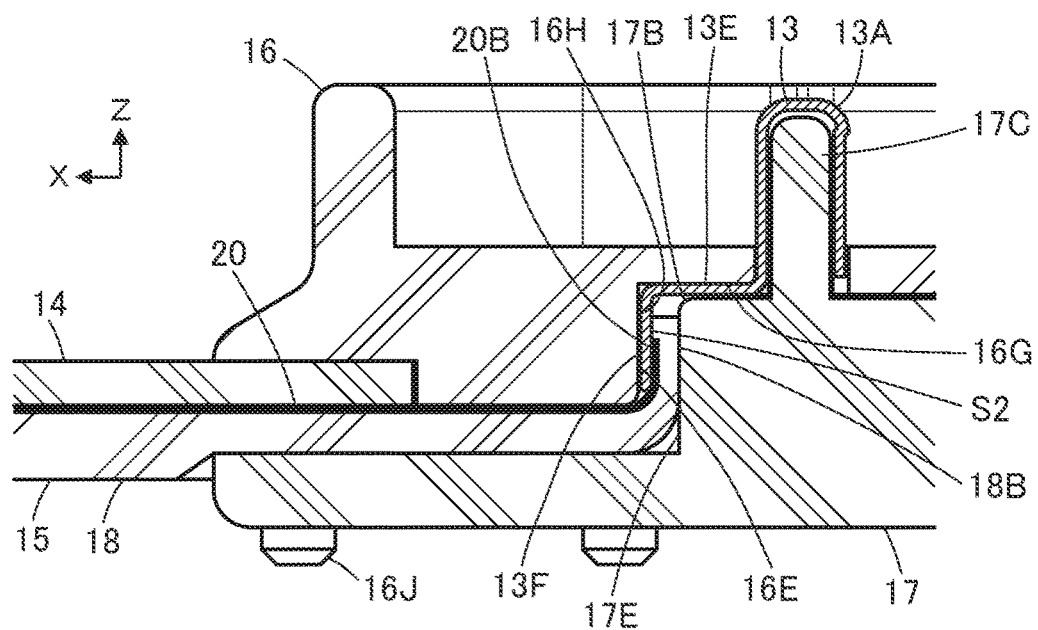
FIG. 16 is an enlarged cross-sectional view partially showing the connector according to the embodiment.

When the second insulator 17 is moved in the +Z direction toward the first insulator 16 with this state being kept, as shown in FIG. 16, the retained portion 13E of each contact 13 is sandwiched between the +Z direction-side surface of the jut portion 17B of the second insulator 17 and the retaining surface 16G inside the recess portion 16E of the first insulator 16. The contacts 13 are retained by the first insulator 16 and the second insulator 17 in this manner.

Further, the protrusion pieces 18B of the sheet body 18 of the sheet type conductive member 15 are pushed and bent toward the +Z direction by the jut portion 17B of the second insulator 17, and in this state, each protrusion piece 18B is sandwiched between the inner wall surface 16H, which constitutes the first opposed surface, of the recess portion 16E of the first insulator 16 and the outer surface 17E, which constitutes the second opposed surface, of the jut portion 17B of the second insulator 17, so that the second end portion 20B of each flexible conductor 20 exposed on the surface of the protrusion piece 18B makes contact at a predetermined contact pressure with the connection portion S2 of the flat plate portion 13F of the corresponding contact 13 being in contact with the inner wall surface 16H of the recess portion 16E of the first insulator 16. Thus, the contacts 13 are electrically connected to the second end portions 20B of the corresponding flexible conductors 20 of the sheet type conductive member 15.

The fixing posts 16J of the first insulator 16 are passed through the corresponding through-holes 17D of the second insulator 17 and project on the −Z direction side of the second insulator 17.

The −Z directional ends of the fixing posts 16J of the first insulator 16 that project on the −Z direction side of the second insulator 17 are heated and deformed whereby the second insulator 17 is fixed with respect to the first insulator 16.

The connector 11 shown in FIG. 1 is thus assembled.

Next, the method of mounting the connector 11 onto a garment 31 is described.

Figure 17:
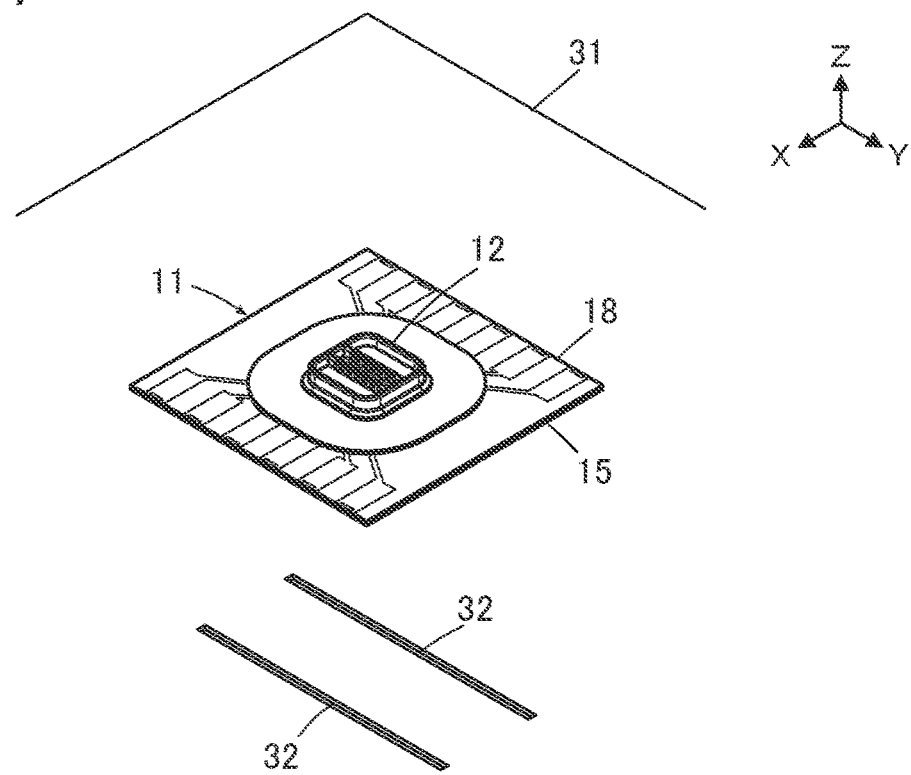
FIG. 17 is a perspective view showing the connector according to the embodiment that is positioned with respect to a surface of a garment.

Two slits 32 are formed in the garment 31 at a position where the connector 11 is to be attached, as shown in FIG. 17. The two slits 32 extend in the Y direction in parallel to each other with a distance therebetween in the X direction and penetrate the garment 31 from the front side to the back side. The two slits 32 have a length in the Y direction slightly larger than the Y directional length of the sheet type conductive member 15 of the connector 11 and are spaced apart from each other in the X direction with a distance slightly larger than the X directional length of the housing 12 of the connector 11.

After the connector 11 is positioned on the +Z direction side of the two slits 32 of the garment 31 thus configured, a portion of the sheet type conductive member 15 situated on the +X direction side of the housing 12 and a portion thereof situated on the −X direction side of the housing 12 are separately passed through the corresponding slits 32 and thereby drawn from the front side toward the back side of the garment 31.

Figure 18:
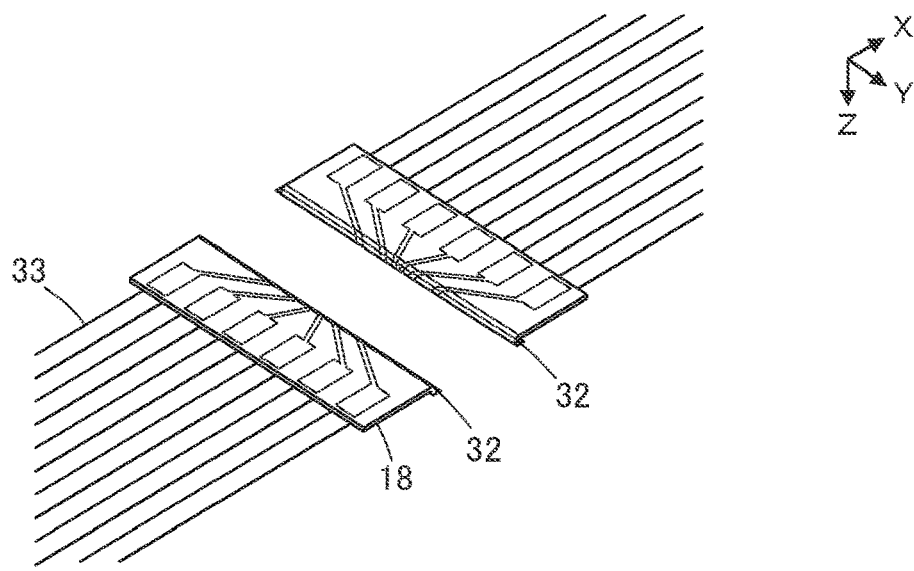
FIG. 18 is a perspective view showing the state where first end portions of flexible conductors of the connector according to the embodiment are superposed on wiring portions of the garment on the back side of the garment.

As shown in FIG. 18, the back side, facing the −Z direction, of the garment 31 is provided with a plurality of conductive wiring portions 33 separately extending in the +X and −X directions perpendicular to the two slits 32. One ends of those wiring portions 33 are arranged in the Y direction with the same arrangement pitch as that of the first end portions 20A of the sheet type conductive member 15 in the vicinity of the corresponding slit 32, and have the substantially same width in the Y direction as that of the first end portions 20A.

The wiring portions 33 are made of, for example, a conductive thread sewn into the garment 31, and at least their surfaces facing the −Z direction have conductivity. The other ends of the wiring portions 33 each extend along the back side of the garment 31 up to an electrode (not shown) attached to the garment 31.

The +X directional portion and the −X directional portion of the sheet type conductive member 15 drawn to the back side, facing the −Z direction, of the garment 31 through the two slits 32 of the garment 31 are disposed to be superposed on the one ends of the wiring portions 33.

Figure 19:
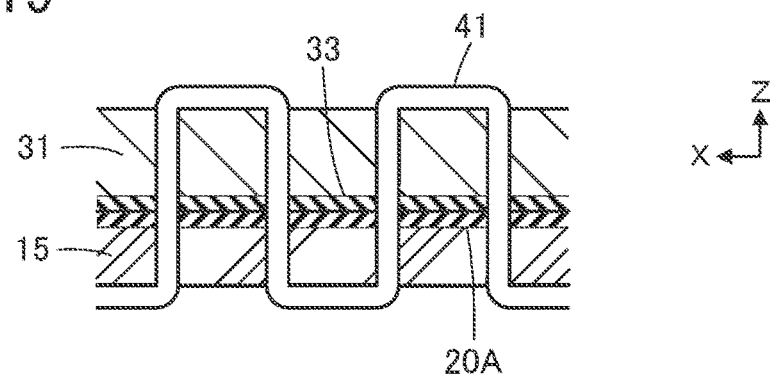
FIG. 19 is a cross-sectional side view showing the first end portion of the flexible conductor of the connector according to the embodiment, the first end portion being sewed to a wiring portion of the garment.

Since the one ends of the wiring portions 33 are arranged in the Y direction with the same arrangement pitch as that of the first end portions 20A of the sheet type conductive member at this time, each first end portion 20A of the sheet type conductive member 15 is superposed on the −Z direction side of the corresponding wiring portion 33 of the garment 31 as shown in FIG. 19.

Then, the garment 31 and the sheet type conductive member are sewed together with a sewing thread 41, whereby the first end portions 20A of the sheet type conductive member 15 can be electrically connected to the wiring portions 33 of the garment 31 on a one-to-one basis.

It should be noted that while the garment 31 and the sheet type conductive member 15 are sewed together with the sewing thread 41 in the form of so-called "running stitch" in FIG. 19, the sewing form is not limited thereto.

The width W1, in the Y direction, of the first end portion 20A of the sheet type conductive member 15 is set larger than the width W2, in the Y direction, of the second end portion 20B as shown in FIG. 15, and the wiring portion 33 of the garment 31 has substantially the same width in the Y direction as that of the first end portion 20A.

Hence, a large contact area can be ensured between the first end portion 20A and the wiring portion 33, so that the first end portion 20A can be electrically connected to the wiring portion 33 with high reliability.

Aside from that, since the width W1, in the Y direction, of the first end portion 20A of the sheet type conductive member 15 is larger than the width W2, in the Y direction, of the second end portion 20B, and the wiring portion 33 of the garment 31 has substantially the same width in the Y direction as that of the first end portion 20A, even when a little misalignment occurs in the Y direction between the first end portions 20A of the sheet type conductive member 15 and the wiring portions 33 of the garment 31 due to manufacturing tolerances of the sheet type conductive member 15 and the wiring portions 33 of the garment 31 or other reasons, the contact area can still be ensured between the first end portions 20A and the wiring portions 33, thus leading to reliable electrical connection therebetween.

The tab sheet 14 of the connector 11 is also sewed on the garment 31 with the sewing thread 41, whereby the connector 11 can be fixed to the garment 31.

Since the first end portion 20A of the sheet type conductive member 15 and the wiring portion 33 of the garment 31 are superposed in the Z direction to make direct contact with each other as shown in FIG. 19, the sewing thread 41 used for sewing may be an insulating thread or a conductive thread.

However, when an insulating thread is used as the sewing thread 41, the plurality of first end portions 20A of the sheet type conductive member 15 can be sewed on the plurality of wiring portions 33 of the garment 31 with the sewing thread 41 all at once.

In the foregoing embodiment, a portion of the sheet type conductive member 15 situated on the +X direction side of the housing 12 and a portion thereof situated on the −X direction side of the housing 12 are separately passed through the corresponding slits 32 of the garment 31 and thereby drawn from the front side toward the back side of the garment 31; however, the invention is not limited thereto. For instance, the connector 11 shown in FIG. 17 can be simply disposed on the surface, facing the +Z direction, of the garment 31 and mounted on the garment 31 without having a portion of the sheet type conductive member 15 drawn to the back side of the garment 31.

Figure 20:
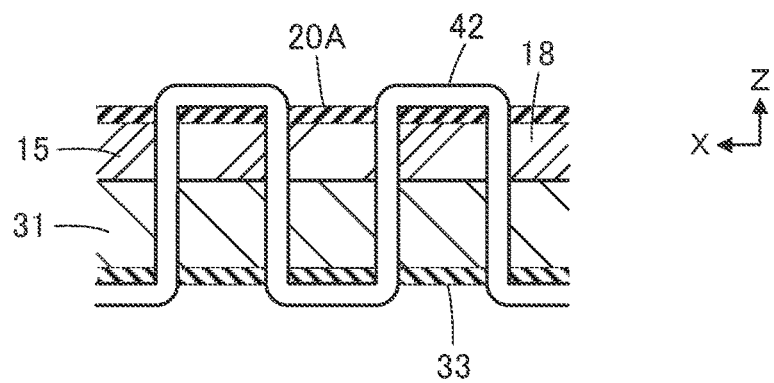
FIG. 20 is a cross sectional side view showing the first end portion of the flexible conductor of the connector according to a modification, the first end portion being sewed to the wiring portion of the garment.

At this time, when each first end portion 20A of the sheet type conductive member 15 is positioned right above the corresponding wiring portion 33 disposed on the back side of the garment 31, as shown in FIG. 20, the first end portion 20A is to be situated on the +Z direction side of the wiring portion 33 via the sheet body 18 of the sheet type conductive member 15 and the garment 31.

Then, the first end portion 20A is sewed through the sheet body 18 and the garment 31 to the wiring portion 33 with the sewing thread 42 having conductivity, whereby the first end portion 20A and the wiring portion 33 can be electrically connected via the sewing thread 42.

For instance, when the number of portions of the sewing thread 42 that penetrate the first end portion 20A and the wiring portion 33 is increased by reducing the stitch length of the sewing thread 42 in the first end portion 20A, the cross-sectional area of a conductive path between the first end portion 20A and the wiring portion 33 is increased, and highly reliable electrical connection can be obtained.

It should be noted that when the sewing thread 42 having conductivity is used, each first end portion 20A has to be sewed to the corresponding wiring portion 33 with an independent sewing thread 42 on a one-to-one basis in order to prevent a short between the plural first end portions 20.

Figure 21:
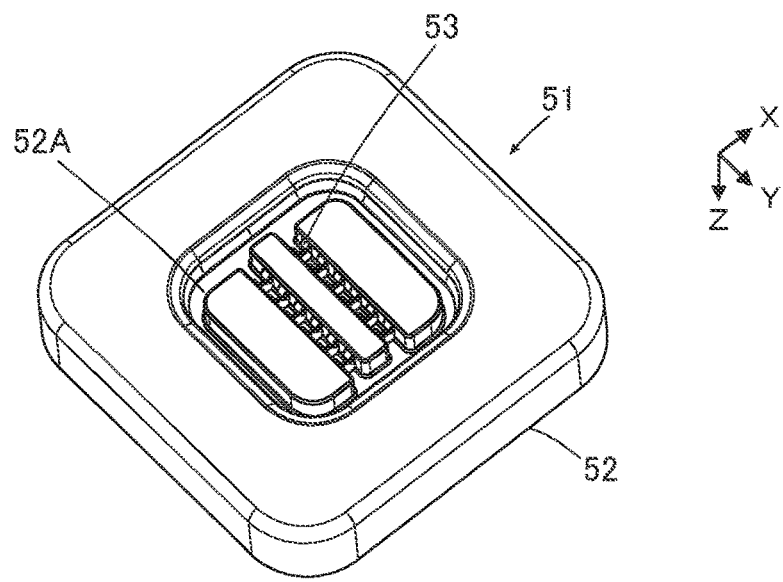
FIG. 21 is a perspective view showing a counter connector to be fitted to the connector according to the embodiment.

FIG. 21 shows a counter connector 51 to be fitted to the connector 11 according to the embodiment. The counter connector 51 includes a housing 52 made of an insulating material, and a plurality of contacts 53 are retained in the housing 52.

The contacts 53 correspond to the contacts 13 of the connector 11 and are arranged in two rows parallel to each other with the same arrangement pitch as that of the contacts 13. Each contact 53 faces the −Z direction and is a receptacle type contact corresponding to the plug type contact 13 of the connector 11.

A peripherally rounding groove 52A facing the −Z direction is formed in the housing 52 to surround the periphery of the contacts 53. The peripherally rounding groove 52A corresponds to the peripheral wall portion 16B of the first insulator 16 of the connector 11.

Figure 22:
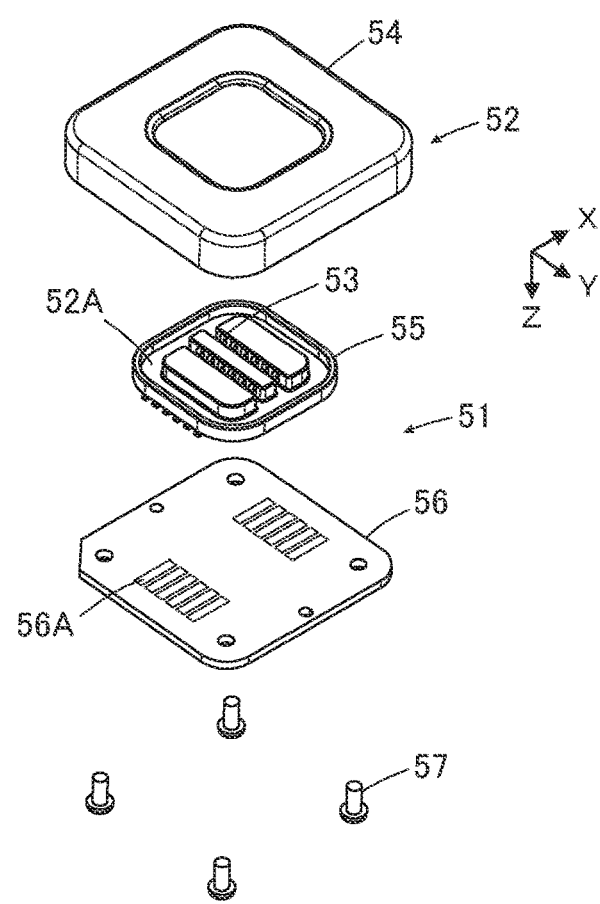
FIG. 22 is an exploded perspective view showing the counter connector.
Figure 23:
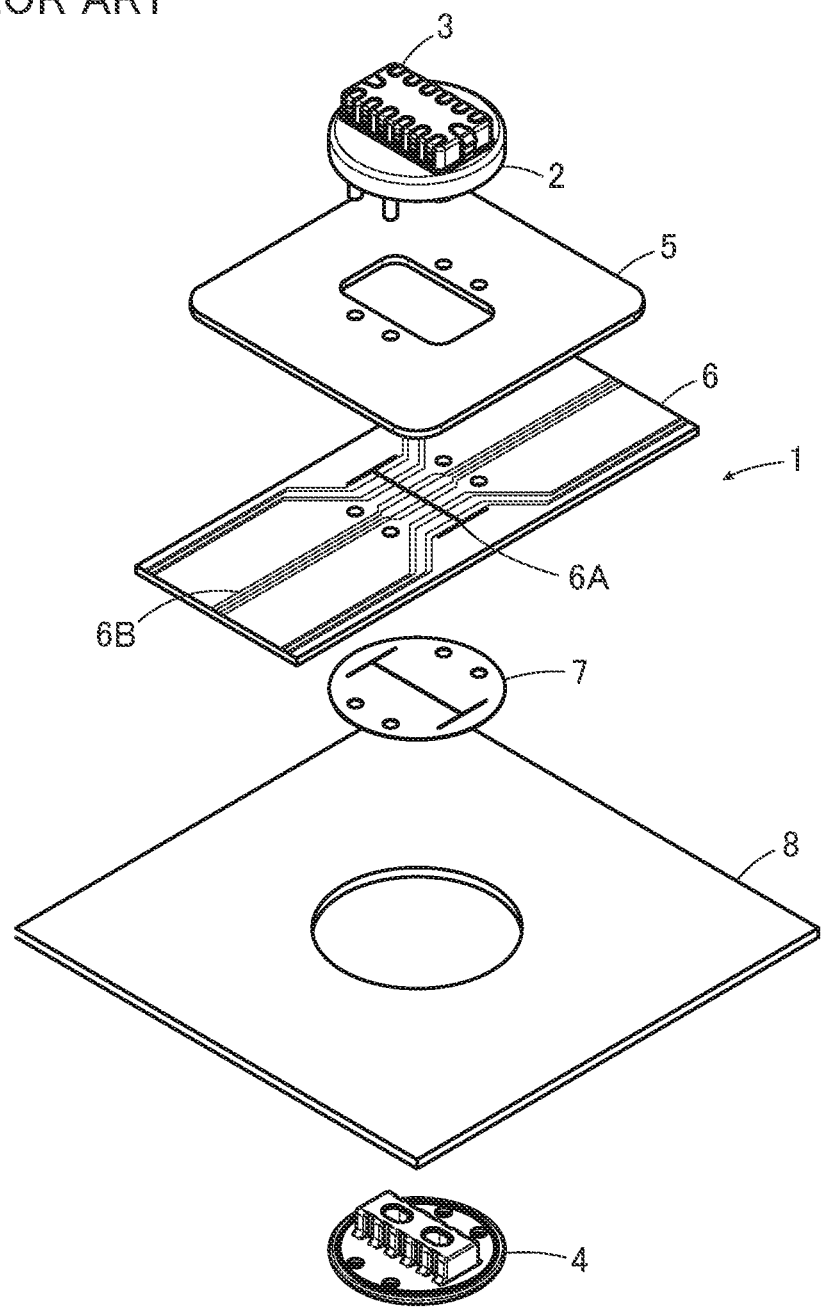
FIG. 23 is an exploded perspective view showing a conventional connector.

The counter connector 51 includes a first insulator 54 and a second insulator 55 as shown in FIG. 22, and these first and second insulators 54 and 55 constitute the housing 52.

The contacts 53 are retained in the second insulator 55, and the peripherally rounding groove 52A is also formed in the second insulator 55.

The counter connector 51 further includes a circuit board 56, and a plurality of fixing screws 57 used to fix the circuit board 56 to the first insulator 54. The contacts 53 retained in the second insulator 55 are connected to a plurality of connection pads 56A of the circuit board 56 by soldering or another method, and the circuit board 56 is fixed to the first insulator 54 by means of the fixing screws 57. Thus, the counter connector 51 is assembled.

Components such as a wireless transmitting circuit (not shown) connected to the contacts 53 are mounted on a surface, facing the +Z direction, of the circuit board 56 opposite from the housing 52.

When the counter connector 51 as above is fitted to the connector 11 mounted on the garment 31 with the contacts 53 facing the −Z direction, the plug type contacts 13 of the connector 11 are inserted into the receptacle type contacts 53 of the counter connector 51 and electrically connected thereto. In addition, the peripheral wall portion 16B of the first insulator 16 of the connector 11 is inserted into the peripherally rounding groove 52A of the housing 52 of the counter connector 51, whereby the counter connector 51 is retained with respect to the connector 11.

Owing to the above configuration, user's biological data such as the heart rate and the body temperature as obtained using electrodes attached to the garment 31 can be input to the wireless transmitting circuit mounted on the circuit board 56 through the wiring portions 33 of the garment 31, the flexible conductors 20 of the sheet type conductive member 15 and the contacts 13 of the connector 11, and the contacts 53 of the counter connector 51, and wirelessly transmitted from the wireless transmitting circuit to a tablet terminal, a stationary measurement device, or the like.

While, in the connector 11 according to the embodiment described above, the contacts 13 are arranged in two rows parallel to each other, the invention is not limited thereto, and the contacts 13 may be arranged in one row. Further, this invention does not necessarily require the plurality of contacts 13, and it suffices if at least one contact 13 is provided.

In the embodiment above, as shown in FIG. 16, the flexible conductor 20 of the sheet type conductive member 15 is exposed on the surface of the sheet body 18 on the +Z direction side, the flat plate portion 13F of the contact 13 makes contact with the inner wall surface 16H of the recess portion 16E of the first insulator 16, the protrusion piece 18B of the sheet type conductive member 15 is sandwiched between the flat plate portion 13F of the contact 13 and the outer surface 17E of the jut portion 17B of the second insulator 17, and the second end portion 20B of the flexible conductor 20 exposed on the surface of the protrusion piece 18B is electrically connected to the contact 13; however, the invention is not limited thereto.

The flexible conductor 20 of the sheet type conductive member 15 may be exposed on the surface of the sheet body 18 on the −Z direction side. In this case, the flat plate portion 13F of the contact 13 is disposed to make contact with the outer surface 17E of the jut portion 17B of the second insulator 17, the protrusion piece 18B of the sheet type conductive member 15 is sandwiched between the flat plate portion 13F of the contact 13 and the inner wall surface 16H of the recess portion 16E of the first insulator 16, and the second end portion 20B of the flexible conductor 20 exposed on the surface of the protrusion piece 18B is electrically connected to the flat plate portion 13F of the contact 13.

For the sheet type conductive member 15 of the connector 11, both portions exposed on the surfaces of the sheet body 18 on the +Z direction side and the −Z direction side may be formed by embroidery using a conductive thread, so that the flexible conductors 20 can be exposed on both surfaces of the sheet body 18.

Aside from that, while the flexible conductor 20 of the sheet type conductive member 15 is formed of a conductive thread embroidered on the sheet body 18 in the embodiment above, the invention is not limited thereto, and the flexible conductor 20 may be formed by weaving a conductive thread into the sheet body 18 made of insulating cloth or knitted fabric.

While in the connector 11 according to the embodiment above, the tab sheet 14 is disposed between the housing 12 and the sheet type conductive member 15, the tab sheet 14 may be omitted when it is not particularly necessary to reinforce the portion receiving the connector 11 when the connector 11 is mounted on the garment 31.

While the connector 11 is mounted on the garment 31 that is the mounting object in the embodiment above, the mounting object is not limited to the garment 31, and the connector 11 may be mounted on, for example, a bag that the user carries or wears, or a sheet, a bed or a bedding piece on or in which the user lies.

What is claimed is:

1. A method of manufacturing a sheet type conductive member that is attached to a connector mounted on a mounting object and that electrically connects a plurality of wiring portions of the mounting object to a plurality of contacts of the connector, the method comprising:
   forming a plurality of flexible conductors and at least one connection conductor by continuously embroidering or weaving a conductive thread on or into a sheet member such that the conductive thread is exposed on a surface of the sheet member, the sheet member having an insulating property and including a sheet body region and a peripheral region situated on a periphery of the sheet body region, the plurality of flexible conductors being situated inside the sheet body region and each including a first end portion electrically connected to a corresponding one of the plurality of wiring portions, a second end portion electrically connected to a corresponding one of the plurality of contacts, and a joint portion joining the first end portion and the second end portion together, and the at least one connection conductor being situated in the peripheral region and interconnecting corresponding two of the plurality of flexible conductors; and separating the peripheral region of the sheet member from the sheet body region and separating the at least one connection conductor from the plurality of flexible conductors.

2. The method according to claim 1,
wherein by cutting the sheet member and the conductive thread along a boundary portion between the sheet body region and the peripheral region, the peripheral region of the sheet member is separated from the sheet body region and the at least one connection conductor is separated from the plurality of flexible conductors.

3. The method according to claim 1,
wherein the conductive thread is embroidered or woven to, in the sheet body region, proceed from the first end portion of one flexible conductor of the plurality of flexible conductors to the second end portion of the one flexible conductor through the joint portion of the one flexible conductor and turn back at the second end portion of the one flexible conductor to return to the first end portion of the one flexible conductor through the joint portion of the one flexible conductor, subsequently to exit from the sheet body region to the peripheral region once, where the conductive thread serves as the connection conductor, and to again go back to the sheet body region to proceed to the first end portion of a next one of the plurality of flexible conductors, and
the embroidering or weaving of the conductive thread is repeated to form the plurality of flexible conductors and a plurality of the connection conductors alternately.

4. The method according to claim 3,
wherein in each of the plurality of flexible conductors, the first end portion is closer to the boundary portion between the sheet body region and the peripheral region than the second end portion is.

5. A sheet type conductive member that is attached to a connector mounted on a mounting object and that electrically connects a plurality of wiring portions of the mounting object to a plurality of contacts of the connector, the sheet type conductive member comprising:
a sheet body having an insulating property; and
a plurality of flexible conductors formed of a conductive thread embroidered on or woven into the sheet body so as to be exposed on a surface of the sheet body, each flexible conductor extending along the surface of the sheet body,
wherein the plurality of flexible conductors each include a first end portion electrically connected to a corresponding one of the plurality of wiring portions, a second end portion electrically connected to a corresponding one of the plurality of contacts, and a joint portion joining the first end portion and the second end portion together, and
a portion of the conductive thread continuing to another portion of the conductive thread which forms the first end portion extends from the first end portion to an edge portion of the sheet body.

6. The sheet type conductive member according to claim 5,
wherein two portions of the conductive thread extend from the first end portion of each of the plurality of flexible conductors up to the edge portion of the sheet body.

7. A connector mounted on the mounting object, the connector comprising:
the sheet type conductive member according to claim 5;
the contact electrically connected to the second end portion of the sheet type conductive member; and
a housing having an insulating property configured to retain the sheet type conductive member and the contact,
wherein the connector is fitted to a counter connector in a fitting direction.

8. The connector according to claim 7,
wherein the housing includes a first insulator and a second insulator that are assembled to each other in a predetermined assembling direction while sandwiching the sheet type conductive member therebetween, and
the contact includes a contacting portion and a connection portion, the contacting portion projecting in the fitting direction from the first insulator and being to make contact with a contact of the counter connector, and the connection portion being situated inside the housing and being connected to the second end portion of the flexible conductor of the sheet type conductive member.

9. The connector according to claim 8,
wherein the first insulator includes a first opposed surface extending in the fitting direction,
the second insulator includes a second opposed surface extending in the fitting direction and facing the first opposed surface, and
the second end portion of the flexible conductor of the sheet type conductive member and the connection portion of the contact are sandwiched between the first opposed surface and the second opposed surface and, in this state, electrically connected to each other.

10. The connector according to claim 8,
wherein the contact includes a retained portion situated between the contacting portion and the connection portion and retained by the housing by being sandwiched between the first insulator and the second insulator.

11. The connector according to claim 10,
wherein the retained portion is sandwiched between the first insulator and the second insulator in the predetermined assembling direction.

12. The connector according to claim 8,
wherein the predetermined assembling direction is same as the fitting direction.

13. The connector according to claim 8, comprising a tab sheet having an insulating property and sandwiched between the first insulator and the sheet type conductive member,
wherein the tab sheet is sewed to the mounting object and thereby fixed to the mounting object.

14. A garment serving as the mounting object on which the connector according to claim 7 is mounted.

15. The garment according to claim 14,
wherein the garment is provided with a slit through which a part of the sheet type conductive member is passed.

16. A connector mounting method for mounting the connector according to claim 7 on a garment serving as the mounting object, the connector mounting method comprising:
- positioning the sheet type conductive member with respect to the garment such that the first end portion of the sheet type conductive member is superposed on the wiring portion of the garment; and
- sewing the first end portion to the wiring portion to thereby attach the sheet type conductive member to the garment and electrically connect the first end portion to the wiring portion.

17. The connector mounting method according to claim 16,
- wherein the wiring portion is disposed on a back side of the garment,
- the second end portion of the sheet type conductive member is disposed on a front side of the garment,
- the first end portion of the sheet type conductive member is passed through a slit formed in the garment to be superposed on the wiring portion on the back side of the garment, and
- the first end portion is sewed to the wiring portion.

\* \* \* \* \*